United States Patent
Park

(10) Patent No.: US 12,182,030 B2
(45) Date of Patent: Dec. 31, 2024

(54) STORAGE DEVICE MANAGING MAP INFORMATION AND METHOD OF OPERATING THE STORAGE DEVICE PRELIMINARY CLASS

(71) Applicant: SK hynix Inc., Icheon (KR)

(72) Inventor: Sung Jin Park, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 18/314,683

(22) Filed: May 9, 2023

(65) Prior Publication Data

US 2024/0193094 A1    Jun. 13, 2024

(30) Foreign Application Priority Data

Dec. 9, 2022    (KR) .................. 10-2022-0171420

(51) Int. Cl.
   *G06F 12/10*    (2016.01)
(52) U.S. Cl.
   CPC .................... *G06F 12/10* (2013.01)

(58) Field of Classification Search
   CPC ........................................ G06F 12/10
   See application file for complete search history.

(56) References Cited

U.S. PATENT DOCUMENTS

| 2021/0248078 A1 | 8/2021 | Grosz | |
| 2022/0188237 A1* | 6/2022 | Cariello | G06F 12/0891 |
| 2024/0061597 A1* | 2/2024 | Lam | G06F 12/0246 |

FOREIGN PATENT DOCUMENTS

KR    20220049027 A    4/2022

* cited by examiner

*Primary Examiner* — Edward J Dudek, Jr.

(57) ABSTRACT

A storage device receives a write request including first data and a first logical address corresponding to the first data, stores the first data in a first memory block among a plurality of memory blocks, determines a second memory block among the plurality of memory blocks to which the first data stored in the first memory block is to be migrated, and stores first map information including the physical address of the second memory block and the first logical address.

11 Claims, 8 Drawing Sheets

FIG.3 first map information

| P2L Index | LBA | SLC PPN | QLC PPN | Flag |
|---|---|---|---|---|
| 1 | 15 | Block : 10<br>Page : 15 | Block : 20<br>Page : 5 | 0 |
| 2 | 5 | Block : 10<br>Page : 16 | Block : 20<br>Page : 6 | 0 |
| 3 | 8 | Block : 10<br>Page : 17 | Block : 20<br>Page : 7 | 0 |
| ⋮ | ⋮ | ⋮ | ⋮ | ⋮ |

FIG.4 first map information

| P2L Index | LBA | SLC PPN | QLC PPN | Flag |
|---|---|---|---|---|
| 1 | 15 | Block : 10<br>Page : 15 | Block : 20<br>Page : 5 | 1 |
| 2 | 5 | Block : 10<br>Page : 16 | Block : 20<br>Page : 6 | 1 |
| 3 | 8 | Block : 10<br>Page : 17 | Block : 20<br>Page : 7 | 0 |
| ⋮ | ⋮ | ⋮ | ⋮ | ⋮ |

FIG.5 first map information

| | P2L Index | LBA | SLC PPN | QLC PPN | Flag |
|---|---|---|---|---|---|
| read request LBA : 15 → | 1 | 15 | Block : 10 Page : 15 | Block : 20 Page : 5 | 1 |
| | 2 | 5 | Block : 10 Page : 16 | Block : 20 Page : 6 | 1 |
| read request LBA : 8 → | 3 | 8 | Block : 10 Page : 17 | Block : 20 Page : 7 | 0 |
| | ⋮ | ⋮ | ⋮ | ⋮ | ⋮ | first map information

| P2L Index | LBA | SLC PPN | QLC PPN | Flag |
|---|---|---|---|---|
| 1 | 15 | Block : 10<br>Page : 15 | Block : 20<br>Page : 5 | 1 |
| 2 | 5 | Block : 10<br>Page : 16 | Block : x<br>Block : x | 1 |
| 3 | 8 | Block : 10<br>Page : 17 | Block : 20<br>Page :6 | 1 |
| ⋮ | ⋮ | ⋮ | ⋮ | ⋮ | unmap
LBA : 5

STORAGE DEVICE MANAGING MAP INFORMATION AND METHOD OF OPERATING THE STORAGE DEVICE PRELIMINARY CLASS

CROSS-REFERENCES TO RELATED APPLICATION

The present application claims priority under 35 U.S.C. 119(a) to Korean patent application number 10-2022-0171420 filed on Dec. 9, 2022, which are incorporated herein by reference in its entirety.

BACKGROUND

1. Technical Field

Various embodiments generally relate to a storage device that manages map information and a method of operating the storage device.

2. Related Art

A storage device is a device that stores data based on a request of an external device such as a computer, a mobile terminal such as a smartphone or a tablet, and various electronic devices.

The storage device may include a controller for controlling a memory (e.g., a volatile memory or a nonvolatile memory). The controller may receive a command from the external device, and may execute or control an operation for reading, writing, or erasing data with respect to the memory included in the storage device, based on the received command.

Meanwhile, the storage device may use map information to manage data stored in the memory. And the storage device may store the map information in the memory.

SUMMARY

Various embodiments are directed to a storage device capable of processing map information more efficiently by pre-recording information on locations where user data is to be stored in the map information, and a method of operating the storage device.

In an embodiment, a storage device may include: i) a memory including a plurality of memory blocks, and ii) a controller configured to receive a write request including first data and a first logical address corresponding to the first data from the outside of the storage device, store the first data in a first memory block among the plurality of memory blocks, determine a second memory block among the plurality of memory blocks to which the first data stored in the first memory block is to be migrated, and store first map information including the physical address of the second memory block and the first logical address.

In an embodiment, a method for operating a storage device may include: i) receiving a write request including first data and a first logical address corresponding to the first data from the outside of the storage device, ii) storing the first data in a first memory block among a plurality of memory blocks, iii) determining a second memory block among the plurality of memory blocks to which the first data stored in the first memory block is to be migrated, and iv) storing first map information including the physical address of the second memory block and the first logical address.

According to the embodiments of the disclosure, it is possible to guarantee efficient map data processing by pre-recording information on locations where user data is to be stored in map information.

BRIEF DESCRIPTION OF THE DRAWINGS

FIG. 3 illustrates a structure of P2L map information managed by a storage device according to an embodiment of the present disclosure.

FIG. 4 illustrates a structure of P2L map information after some data is migrated in a storage device according to an embodiment of the present disclosure.

FIG. 5 illustrates an operation of reading data according to an embodiment of the present disclosure.

DETAIL DESCRIPTION

Figure 1:
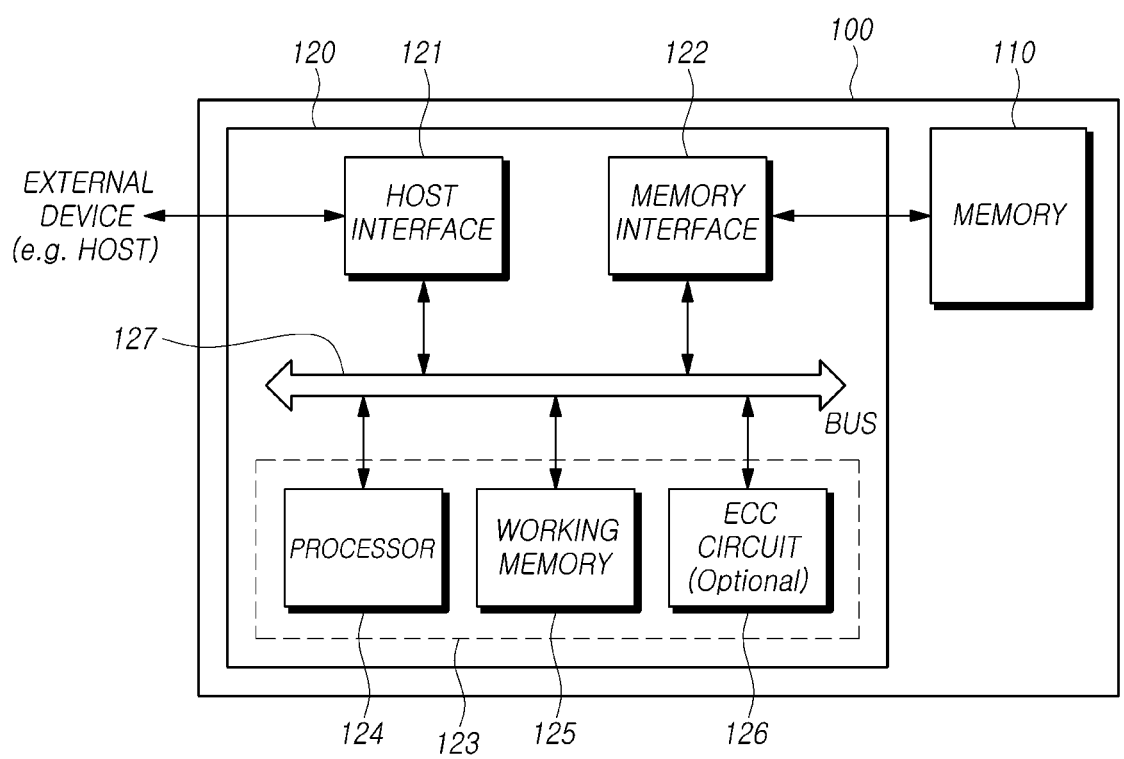
FIG. 1 illustrates a storage device according to an embodiment of the present disclosure.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 illustrates a storage device 100 according to an embodiment of the present disclosure.

Referring to FIG. 1, the storage device 100 may include a memory 110 that stores data and a controller 120 that controls the memory 110.

The memory 110 includes a plurality of memory blocks, and operates under the control of the controller 120. Operations of the memory 110 may include a read operation, a program operation (also referred to as a write operation), and an erase operation.

The memory 110 may include a memory cell array including a plurality of memory cells (also simply referred to as "cells") that store data. Such a memory cell array may exist in a memory block.

For example, the memory 110 may be realized in various types of memory such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM), and a spin transfer torque random access memory (STT-RAM).

The memory 110 may be implemented as a three-dimensional array structure. For example, embodiments of the present disclosure may be applied to a charge trap flash (CTF) in which a charge storage layer is configured by a dielectric layer and a flash memory in which a charge storage layer is configured by a conductive floating gate.

The memory 110 may receive a command and an address from the controller 120 and may access an area in the memory cell array that is selected by the address. In other words, the memory 110 may perform an operation indicated by the command on the area selected by the address.

The memory 110 may perform a program operation, a read operation, or an erase operation. For example, when performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (or program), read, erase, and background operations for the memory 110. For example, the background operation may include at least one from among a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. The controller 120, however, also may control the operation of the memory 110 regardless of or in the absence of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, and a mobility device (e.g., a vehicle, a robot or a drone) capable of driving under human control or autonomous driving, as non-limiting examples.

The host may include at least one operating system (OS). The operating system may generally manage and control the function and operation of the host, and may provide interoperability between the host and the storage device 100. The operating system may be classified into a general operating system and a mobile operating system depending on the mobility of the host.

The controller 120 and the host may be devices that are separated from each other, or the controller 120 and the host may be integrated into one device. Hereunder, for the sake of convenience in explanation, descriptions will describe the controller 120 and the host as devices that are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface that uses at least one from among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an IDE (integrated drive electronics) protocol, and a private protocol.

When receiving a command from the host, the control circuit 123 may receive the command through the host interface 121, and may perform an operation of processing the received command.

The memory interface 122 may be coupled with the memory 110 to provide an interface for communication with the memory 110. That is to say, the memory interface 122 may be configured to provide an interface between the memory 110 and the controller 120 under the control of the control circuit 123.

The control circuit 123 performs the general control operations of the controller 120 to control the operation of the memory 110. To this end, for instance, the control circuit 123 may include at least one of a processor 124 and a working memory 125, and may optionally include an error detection and correction circuit (ECC circuit) 126.

The processor 124 may control general operations of the controller 120, and may perform a logic calculation. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the logical block address (LBA) into the physical block address (PBA) by using a mapping table.

There are various address mapping methods of the flash translation layer depending on a mapping unit. Representative address mapping methods include a page mapping method, a block mapping method, and a hybrid mapping method.

The processor 124 may randomize data received from the host. For example, the processor 124 may randomize data received from the host by using a set randomizing seed. The randomized data may be provided to the memory 110, and may be programmed to the memory cell array of the memory 110.

In a read operation, the processor 124 may derandomize data received from the memory 110. For example, the processor 124 may derandomize data received from the memory 110 by using a derandomizing seed. The derandomized data may be outputted to the host.

The processor 124 may execute firmware to control the operation of the controller 120. Namely, in order to control the general operation of the controller 120 and perform a logic calculation, the processor 124 may execute (or drive) firmware loaded in the working memory 125 upon booting. Hereafter, an operation of the storage device 100 according to embodiments of the present disclosure will be described as implementing a processor 124 that executes firmware in which the corresponding operation is defined.

Firmware, as a program to be executed in the storage device 100 to drive the storage device 100, may include various functional layers. For example, the firmware may include binary data in which codes for executing the functional layers, respectively, are defined.

For example, the firmware may include at least one from among a flash translation layer (FTL), which performs a translating function between a logical address requested to the storage device 100 from the host and a physical address of the memory 110; a host interface layer (HIL), which serves to analyze a command requested to the storage device 100 as a storage device from the host and transfer the command to the flash translation layer (FTL); and a flash interface layer (FIL), which transfers a command, instructed from the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation, which is defined in the firmware loaded in the working memory 125, to control the general operation of the controller 120. The processor 124 may store a result of performing the logic calculation defined in the firmware, in the working memory 125. The processor 124 may control the controller 120 according to a result of performing the logic calculation defined in the firmware such that the controller 120 generates a command or a signal. When a part of firmware in which a logic calculation to be performed is defined is stored in the memory 110, but not loaded in the working memory 125, the processor 124 may generate an event (e.g., an interrupt) for loading the corresponding part of the firmware into the working memory 125 from the memory 110.

The processor 124 may load metadata necessary for driving firmware from the memory 110. The metadata, as data for managing the memory 110, may include management information on user data stored in the memory 110.

Firmware may be updated while the storage device 100 is manufactured or while the storage device 100 is operating. The controller 120 may download new firmware from the outside of the storage device 100 and update existing firmware with the new firmware.

To drive the controller 120, the working memory 125 may store necessary firmware, a program code, a command, and data. The working memory 125 may be a volatile memory that includes, for example, at least one from among an SRAM (static RAM), a DRAM (dynamic RAM), and an SDRAM (synchronous DRAM).

The error detection and correction circuit 126 may detect an error bit of target data, and correct the detected error bit by using an error correction code. The target data may be data stored in the working memory 125 or data read from the memory 110.

The error detection and correction circuit 126 may decode data by using an error correction code. The error detection and correction circuit 126 may be realized by various code decoders. For example, a decoder that performs unsystematic code decoding or a decoder that performs systematic code decoding may be used.

For example, the error detection and correction circuit 126 may detect an error bit by a unit of sectors in each of read data when each read data is constituted by a plurality of sectors. A sector may mean a data unit that is smaller than a page, which is a read unit of a flash memory. Sectors constituting each read data may be matched with one another using an address.

The error detection and correction circuit 126 may calculate a bit error rate (BER), and may determine whether an error is correctable or not by the unit of sectors. For example, when the bit error rate (BER) is higher than a reference value, the error detection and correction circuit 126 may determine that a corresponding sector is uncorrectable or failed. On the other hand, when a bit error rate (BER) is lower than the reference value, the error detection and correction circuit 126 may determine that a corresponding sector is correctable or passed.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, the error detection and correction circuit 126 may detect a sector which is uncorrectable in the last read data. There may be one or more sectors that are determined to be uncorrectable. The error detection and correction circuit 126 may transfer information (e.g., address information) regarding a sector which is determined to be uncorrectable to the processor 124.

A bus 127 may be configured to provide channels among the components 121, 122, 124, 125 and 126 of the controller 120. The bus 127 may include, for example, a control bus for transferring various control signals, commands and the like, a data bus for transferring various data, and so forth.

Some components among the above-described components 121, 122, 124, 125, and 126 of the controller 120 may be omitted, or some components among the above-described components 121, 122, 124, 125, and 126 of the controller 120 may be integrated into one component. In addition to the above-described components 121, 122, 124, 125, and 126 of the controller 120, one or more other components may be added.

Figure 2:
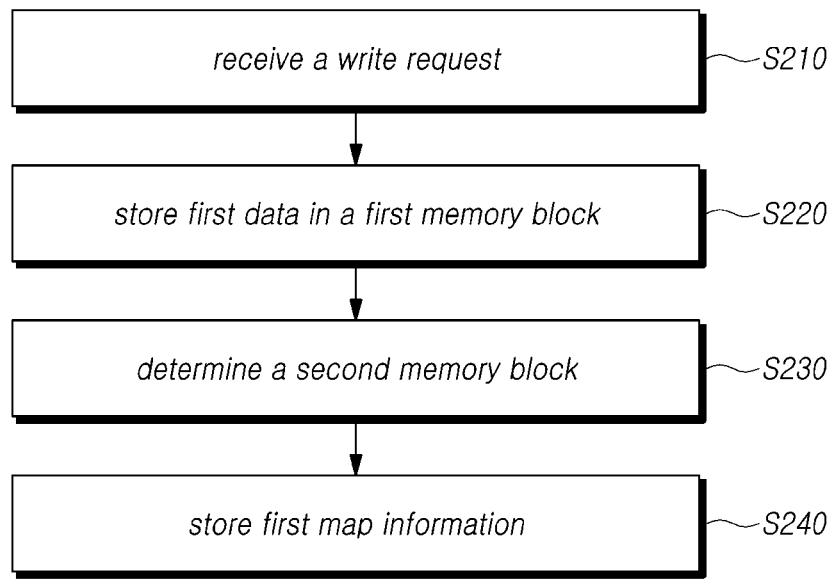
FIG. 2 illustrates an operation of updating map information according to an embodiment of the present disclosure.

FIG. 2 illustrates an operation of updating map information according to an embodiment of the present disclosure. The operation of FIG. 2 may be performed by the storage device 100 of FIG. 1.

Referring to FIG. 2, the storage device 100 may receive a write request from an external device (e.g., host) of the storage device 100 (S210). In this case, the write request may include first data to be stored in the storage device 100 and a first logical address corresponding to the first data.

The controller 120 of the storage device 100 may determine a first memory block, which is a memory block to store the first data received from the external device, from among a plurality of memory blocks included in the memory 100, and store the first data in the first memory block (S220).

In this case, the first memory block in which the first data is stored may be a Single Level Cell (SLC) memory block in which each memory cell stores 1-bit data.

The controller 120 may determine a second memory block to which the first data stored in the first memory block is to be migrated, from among the plurality of memory blocks included in the memory 110 (S230).

In this case, the second memory block may store data of 2 bits or more per memory cell. For example, the second memory block may be a Multi-Level Cell (MLC) memory block storing 2-bit data in each memory cell, a Triple Level Cell (TLC) memory block storing 3-bit data in each memory cell, or a Quad Level Cell (QLC) memory block storing 4-bit data in each memory cell.

The controller 120 may manage map information indicating a mapping relationship between a logical address received from the external device and a physical address indicating a location where data corresponding to the logical address is to be stored in the memory 110.

The map information may comprise at least one of Logical to Physical (L2P) map information in which an index key is identified by a logical address received from an external device, or Physical to Logical (P2L) map information in which an index key is identified by a physical address of a memory block.

The controller 120 may store first map information that is map information including i) the first logical address corresponding to the first data and ii) location information of the second memory block to which the first data is to be migrated (S240).

Hereinafter, a case where the first map information is P2L map information will be described as an example.

FIG. 3 illustrates a structure of P2L map information managed by a storage device 100 according to an embodiment of the present disclosure. The storage device 100 may correspond to the storage device 100 of FIG. 1.

The P2L map information may include P2L index information, SLC PPN (Physical Page Number) information, and QLC PPN information. The SLC PPN information is physical address information of a first memory block (e.g., SLC memory block) in which first data is stored. The QLC PPN information is physical address information of a second memory block (e.g., QLC memory block) to which the first data is to be migrated.

Additionally, the P2L map information may include Logical Block Address (LBA) information that is a logical address corresponding to the first data. The LBA information of the first data may be a first logical address.

The P2L map information may additionally include flag information indicating whether the first data stored in the first memory block has been migrated to the second memory block. In FIG. 3, the flag information may indicate whether the first data has been migrated to a location indicated by the QLC PPN information included in the P2L map information.

For example, P2L map information at a position of a P2L index #1 of the P2L index information may correspond to a physical address of the first memory block. The first data stored at the location indicated by the physical address of the first memory block corresponding to the P2L index #1 may be data corresponding to a logical address 15.

In addition, the location indicated by the physical address of the first memory block corresponding to the P2L index #1 may be a page 15 of a memory block 10, and the location indicated by a physical address of the second memory block to which the first data is to be migrated may be a page 5 of a memory block 20. At this time, the flag information may be 0, indicating that the first data corresponding to the P2L index #1 is not yet migrated from the first memory block to the second memory block.

As another example, P2L map information at a position of a P2L index #2 of the P2L index information may correspond to the physical address of the first memory block. The first data stored at the location indicated by the physical address of the first memory block corresponding to the P2L index #2 may be data corresponding to a logical address 5.

In addition, the location indicated by the physical address of the first memory block corresponding to the P2L index #2 may be a page 16 of the memory block 10, and the location indicated by the physical address of the second memory block to which the first data is to be migrated may be a page 6 of the memory block 20. At this time, the flag information may be 0, indicating that the first data corresponding to the P2L index #2 is not yet migrated from the first memory block to the second memory block.

As another example, P2L map information at a position of a P2L index #3 of the P2L index information may correspond to the physical address of the first memory block. The first data stored at the location indicated by the physical address of the first memory block corresponding to the P2L index #3 may be data corresponding to a logical address 8.

The location indicated by the physical address of the first memory block corresponding to the P2L index #3 may be a page 17 of the memory block 10, and the location indicated by the physical address of the second memory block to which the first data is to be migrated may be a page 7 of the memory block 20. At this time, the flag information may be 0, indicating that the first data corresponding to the P2L index #3 is not yet migrated from the first memory block to the second memory block.

Meanwhile, the P2L map information may be expressed in various structures other than the structure described in FIG. 3. For example, the SLC PPN information described in FIG. 3 may not be separately included in the P2L map information, and the SLC PPN information may be calculated based on the P2L index information.

Similarly, the QLC PPN information may not be separately included in the P2L map information, and the QLC PPN information may be calculated based on the P2L index information.

In addition, in FIG. 3, the value "0" is used as the flag information to indicate that the first data is not yet migrated to the second memory block. However, in another embodiment, a value other than 0 may be used.

Meanwhile, in the embodiment of the present disclosure, the format of values stored in the SLC PPN information and the QLC PPN information of the P2L map information is (block, page), but alternatively, it may be (block, page, offset) or (die, plane, block, page, offset), or the like.

FIG. 4 illustrates a structure of the P2L map information after some data have been migrated in the storage device 100 according to an embodiment of the present disclosure.

For example, the P2L map information at the position of the P2L index #1 may correspond to the physical address of the first memory block. The first data stored at the location indicated by the physical address of the first memory block corresponding to the P2L index #1 may correspond to the logical address 15.

The location indicated by the physical address of the first memory block corresponding to the P2L index #1 may be the page 15 of the memory block 10, and the location indicated by the physical address of the second memory block to which the first data has been migrated may be the page 5 of the memory block 20.

In this case, the flag information may be 1, indicating that the first data corresponding to the P2L index #1 has been migrated from the first memory block to the second memory block. That is, the first data corresponding to the logical address 15 may be stored in both the location indicated by the physical address indicated by the SLC PPN information and the location indicated by the physical address indicated by the QLC PPN information, or the first data corresponding to the logical address 15 may be stored only at the location indicated by the physical address indicated by the QLC PPN information.

As another example, the P2L map information at the position of the P2L index #2 may correspond to the physical address of the first memory block. The first data stored at the location indicated by the physical address of the first memory block corresponding to the P2L index #2 may correspond to the logical address 5.

The location indicated by the physical address of the first memory block corresponding to the P2L index #2 may be the page 16 of memory block 10, and the location indicated by the physical address of the second memory block to which the first data has been migrated may be the page 6 of the memory block 20.

In this case, the flag information may be 1, indicating that the first data corresponding to the P2L index #2 has been migrated from the first memory block to the second memory block. That is, the first data corresponding to the logical address 5 may be stored in both the location indicated by the physical address indicated by the SLC PPN information and the location indicated by the physical address indicated by the QLC PPN information, or the first data corresponding to the logical address 5 may be stored only in the location indicated by the physical address indicated by the QLC PPN information.

While the first data corresponding to the P2L index #1 and the P2L index #2 have been migrated from the first memory block to the second memory block, the first data stored at the location indicated by the physical address of the first memory block corresponding to the P2L index #3 may not be migrated to the second memory block. Therefore, at this time, the flag information may be 0, indicating that the first data corresponding to the P2L index #3 is not yet migrated from the first memory block to the second memory block.

FIG. 5 illustrates an operation of reading data according to an embodiment of the present disclosure.

The storage device 100 of FIG. 1 may receive a read request from the external device of the storage device 100. The received read request may include a first logical address corresponding to the first data described above.

The controller 120 of the storage device 100 may check whether the first logical address exists in the aforementioned P2L map information. When map information corresponding to the first logical address exists in the P2L map information, the controller 120 may determine where the first data exists based on the flag information corresponding to the first logical address.

The controller 120 may read the first data corresponding to the read request from the first memory block or the second memory block according to the flag information.

When it is determined that the first data corresponding to the first logical address exists in the first memory block, the controller 120 may read the SLC PPN information of the P2L map information and transmit the first data existing at the location indicated by the SLC PPN information to the external device.

On the other hand, when it is determined that the first data corresponding to the first logical address is migrated to the second memory block, the controller 120 may read the QLC PPN information of the P2L map information and transmit the first data existing at the location indicated by the QLC PPN to the external device.

FIG. 5 illustrates a case in which read requests including logical addresses 15 and 8 are received from the external device.

For example, the controller 120 may receive a read request for the logical address 15 from the external device and check whether information corresponding to the logical address 15 exists in the P2L map information.

When the controller 120 confirms that the information corresponding to the logical address 15 exists in the P2L map information and flag information corresponding to the logical address 15 is 1, the controller 120 may determine that the first data corresponding to the logical address 15 is migrated from the first memory block to the second memory block.

When the controller 120 determines that the first data corresponding to the logical address 15 is migrated to the second memory block, the controller 120 may read the first data corresponding to the logical address 15 from the second memory block based on the QLC PPN information of the P2L map information, and transmit the first data to the external device.

As another example, the controller 120 may receive a read request for the logical address 8 from the external device and check whether information corresponding to the logical address 8 exists in the P2L map information.

When the controller 120 confirms that the information corresponding to the logical address 8 exists in the P2L map information and flag information corresponding to the logical address 8 is 0, the controller 120 may determine that the first data corresponding to the logical address 8 is not yet migrated from the first memory block to the second memory block.

When the controller 120 determines that the first data corresponding to the logical address 8 is not yet migrated to the second memory block, the controller 120 may read the first data corresponding to the logical address 8 from the first memory block based on the SLC PPN information of the P2L map information, and transmit the first data to the external device.

Meanwhile, in an embodiment of the present disclosure, the storage device 100 may update second map information including the first logical address and the physical address of the second memory block based on the aforementioned first map information or a state of the first memory block. In this case, the second map information may be L2P map information.

Hereinafter, a case in which the first map information is P2L map information and the second map information is L2P map information will be described with reference to FIG. 6.

Figure 6:
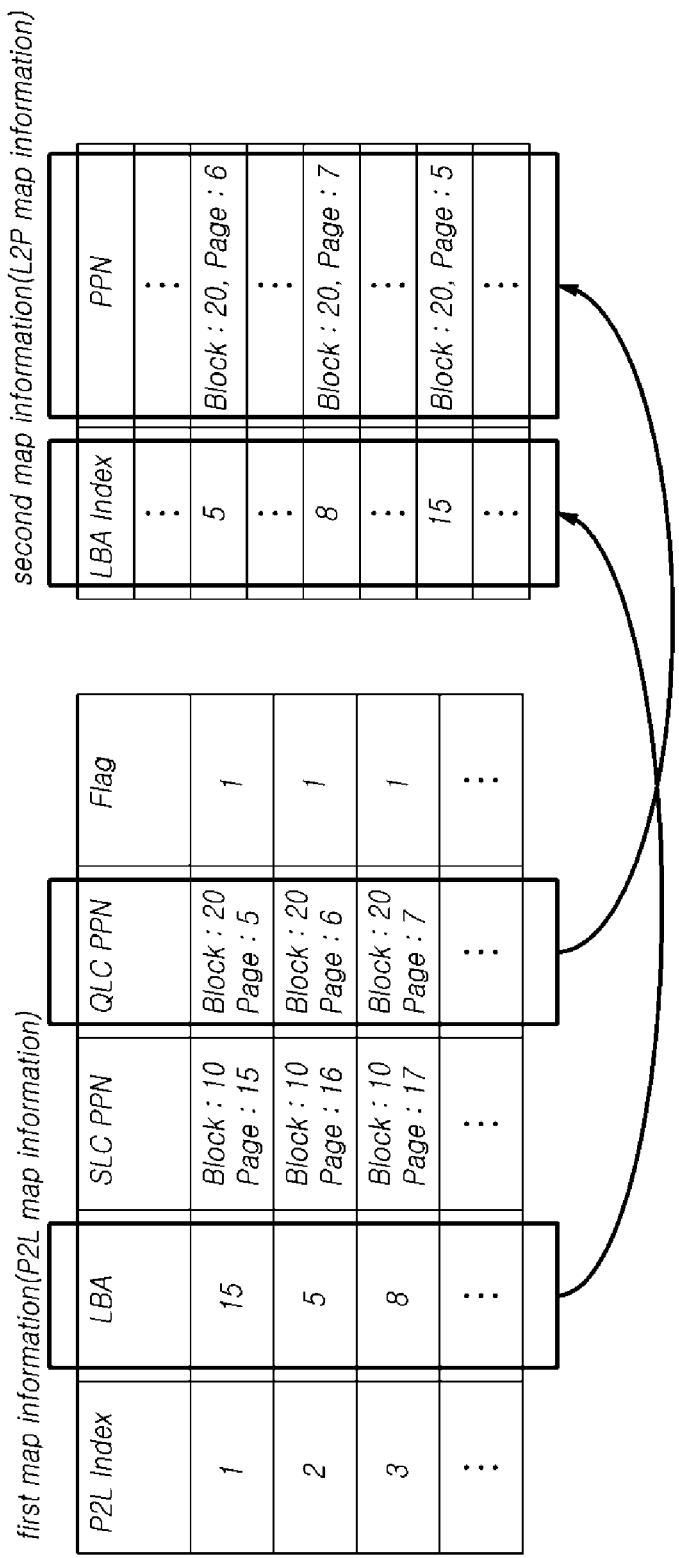
FIG. 6 illustrates an operation of updating L2P map information based on P2L map information according to an embodiment of the present disclosure.

FIG. 6 illustrates an operation of updating L2P map information based on P2L map information according to an embodiment of the present disclosure. The L2P map information may correspond to the second map information, and the P2L map information may correspond to the first map information.

The storage device 100 of FIG. 1 may update the L2P map information, i.e., the second map information, based on the P2L map information, i.e., the first map information, when a specified condition is satisfied. For example, the specified condition may be satisfied when the size of data managed by the P2L map information is greater than or equal to a threshold data size, when the size of the first data stored in the first memory block is greater than or equal to the threshold data size, or when the number of empty pages included in the first memory block is lower than or equal to a threshold value. Alternatively, the specified condition may be satisfied when available storage capacity of the P2L map information is less than or equal to a threshold capacity or when all pages of the first memory block are full of data.

FIG. 6 illustrates updating L2P map information based on P2L map information of first data that has been migrated to the second memory block.

The controller 120 of the storage device 100 may determine a P2L index of L2P map information to be updated based on a P2L index of L2P map information that has not yet been updated. In FIG. 6, the controller 120 determines the P2L index #1 as the P2L index of the L2P map information to be updated.

The controller 120 may determine the L2P map information requiring updating based on a logical address of P2L map information. PPN information for a logical address and a physical address may be stored in the L2P map information that needs to be updated. Meanwhile, in another embodiment, the logical address of the L2P map information may not be stored in a separate field, but may be identified as an offset of data corresponding to the logical address instead.

The controller 120 may determine L2P map information corresponding to the logical address 15 which corresponds to the P2L index #1 of the P2L map information, and update a physical address corresponding to the logical address 15 in the L2P map information. The physical address updated in the L2P map information may correspond to QLC PPN information of the P2L map information corresponding to the P2L index #1. Accordingly, the physical address corresponding to the logical address 5 of the L2P information after the updating may be represented as the page 5 of the memory block 20.

After updating the L2P map information based on the P2L map information corresponding to the P2L index #1 in the P2L map information, the controller 120 may determine L2P map information corresponding to the logical address 5 corresponding to the P2L index #2 and update a physical address corresponding to the logical address 5 in the L2P map information. The physical address updated in the L2P map information may correspond to QLC PPN information of the P2L map information corresponding to the P2L index #2. Therefore, after the updating, the physical address corresponding to the logical address 5 of the L2P map information may be represented as the page 6 of the memory block 20.

After updating the L2P map information based on the P2L map information corresponding to the P2L index #2 in the P2L map information, the controller 120 may determine L2P map information corresponding to the logical address 8 corresponding to the P2L index #3 and update a physical address corresponding to the logical address 8 in the L2P map information. The physical address updated in the L2P map information may correspond to QLC PPN information of the P2L map information corresponding to the P2L index #3. Therefore, after the updating, the physical address corresponding to the logical address 8 of the L2P map information may be represented as the page 7 of the memory block 20.

The storage device 100 may update the L2P map information based on the P2L map information in the above manner. Thereafter, the P2L map information corresponding to the updated L2P information may be initialized or used to store other P2L map information.

Figure 7:
FIG. 7 illustrates an operation of updating P2L map information when receiving an unmap request according to an embodiment of the present disclosure.

FIG. 7 illustrates an operation of updating P2L map information when receiving an unmap request according to embodiment of the present disclosure. The P2L map information may correspond to the first map information.

The storage device 100 of FIG. 1 may receive the unmap request from the outside of the storage device 100, i.e., from an external device. When data stored in the storage device 100 is no longer used, the storage device 100 may receive the unmap request for the data from the external device. In this case, the unmap request may include a logical address of the data to be unmapped.

As described above, the controller 120 of the storage device 100 may receive the unmap request including the logical address of the data to be unmapped from the external device. If the logical address included in the unmap request exists in the first map information, that is, in the P2L map information, the controller 120 may update P2L map information corresponding to the logical address.

FIG. 7 describes an operation in which the storage device 100 updates the P2L map information after the storage device 100 receives the unmap request including the logical address 5 from the external device.

The controller 120 may check whether information corresponding to the logical address 5 included in the unmap request exists in the P2L map information. When the information corresponding to the logical address 5 exists in the P2L map information, the controller 120 may update a part of data corresponding to the logical address 5 to indicate that the data corresponding to the logical address 5 is unmapped.

In FIG. 7, after receiving the unmap request for the logical address 5, the controller 120 may initialize QLC PPN information corresponding to the logical address 5 in the P2L map information.

Meanwhile, in the embodiment of the present disclosure, an operation of initializing the QLC PPN information when the unmap request is received is described as an example, but embodiments are not limited thereto. In another embodiment, the controller 120 may modify SLC PPN information or other information in the P2L map information instead of the QLC PPN information.

Figure 8:
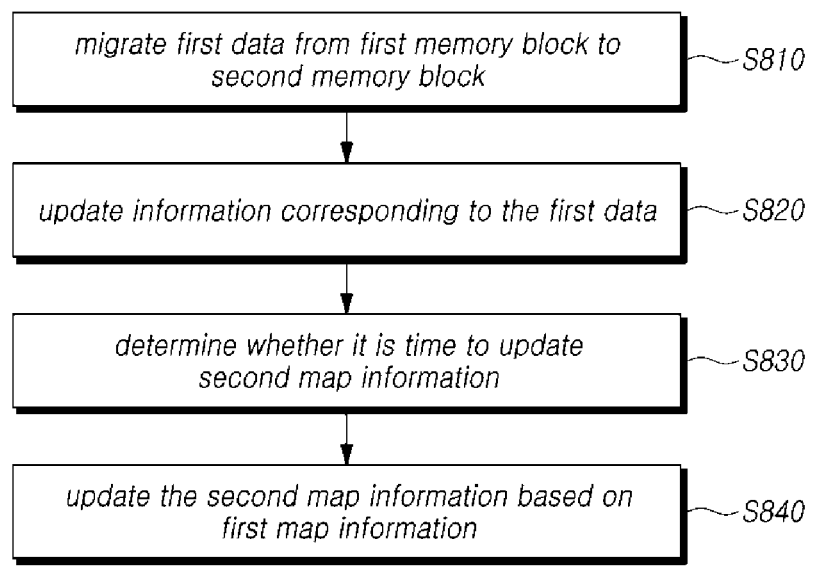
FIG. 8 illustrates an operating method of updating map information according to an embodiment of the present disclosure.

FIG. 8 illustrates an operating method of updating map information according to an embodiment of the present disclosure.

The controller 120 of the storage device 100 of FIG. 1 may store first data received from the outside of the storage device 100, i.e., from an external device, in a first memory block (e.g., SLC memory block) and then migrate the first data to a second memory block (e.g., QLC memory block) (S810). In this case, a time point at which the migration occurs may vary according to a specified condition.

For example, when all pages of the first memory block are full of first data or the size of first data corresponding to the first map information (e.g., P2L map information) is greater than or equal to a threshold data size, the migration may occur from the first memory block to the second memory block.

When the migration occurs, the storage device 100 may check QLC PPN information of the first map information and migrate the first data stored at the location indicated by SLC PPN information to the location indicated by the QLC PPN information.

After the first data is migrated to the second memory block, the controller 120 of the storage device 100 may update information corresponding to the first data in the first map information (S820). In an embodiment, flag information corresponding to a logical address corresponding to the migrated first data is changed. However, in another embodiment, a P2L index corresponding to the migrated first data may be stored in a separate table.

After updating the first map information corresponding to the migrated first data, the controller 120 may determine whether it is time to update the second map information (e.g., L2P map information) (S830).

The controller 120 may determine when to update the second map information according to the size of data, which is not reflected in the second map information, among the first data stored in the first memory block.

Alternatively, when data is additionally stored in a designated page of the first memory block, the controller 120 may determine that it is time to update the second map information.

When it is determined that it is time to update the second map information, the controller 120 of the storage device 100 may update the second map information based on the first map information (S840).

The controller 120 may check whether the first data is migrated to the second memory block based on flag information of the first map information. When the first data is migrated to the second memory block, the controller 120 may update a corresponding physical address of the second map information with the QLC PPN information of the first map information. On the other hand, when the first data is not migrated to the second memory block, the controller 120 may update the physical address of the second map information with the SLC PPN information of the first map information.

Meanwhile, in the present disclosure, the L2P map information is described as being composed of one table, but the L2P map information may be divided into a plurality of segments and managed according to the overall size of the L2P map information.

Although the embodiments of the present disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A storage device comprising:
   a memory including a plurality of memory blocks; and
   a controller configured to:
   receive a write request including first data and a first logical address corresponding to the first data from an external device,
   store the first data in a first memory block among the plurality of memory blocks,
   determine a second memory block, among the plurality of memory blocks, to which the first data stored in the first memory block is to be migrated, and
   store first map information including a physical address of the second memory block and the first logical address,
   wherein the controller is configured to update, after the first data stored in the first memory block is migrated to the second memory block, second map information to include the first logical address and the physical address of the second memory block that are stored in the first map information according to a state of the first map information or a state of the first memory block,
   wherein the first map information is Physical to Logical (P2L) map information in which an index key is identified by a physical address of a memory block, and
   wherein the second map information is Logical to Physical (L2P) map information in which an index key is identified by a logical address.

2. The storage device according to claim 1,
   wherein the first map information includes flag information indicating whether the first data stored in the first memory block is migrated to the second memory block.

3. The storage device according to claim 2,
   wherein the controller is configured to receive a read request including the first logical address from the external device, and
   read the first data from the first memory block or the second memory block according to the flag information.

4. The storage device according to claim 1,
   wherein the controller is configured to read, when a read request including the first logical address corresponding to the first data is received from the external device after updating the second map information, the first data corresponding to the read request from the second memory block.

5. The storage device according to claim 1,
   wherein the controller is configured to delete, when receiving an unmap request for the first logical address corresponding to the first data from the external device, the physical address of the second memory block corresponding to the first data from the first map information.

6. The storage device according to claim 1,
   wherein the first memory block is a Single Level Cell (SLC) memory block, and
   the second memory block is a Multi-Level Cell (MLC) memory block, a Triple Level Cell (TLC) memory block, or a Quad Level Cell (QLC) memory block.

7. A method of operating a storage device, the method comprising:
   receiving a write request including first data and a first logical address corresponding to the first data from an external device of the storage device;
   storing the first data in a first memory block among a plurality of memory blocks;
   determining a second memory block, among the plurality of memory blocks, to which the first data stored in the first memory block is to be migrated; and
   storing first map information including a physical address of the second memory block and the first logical address,
   wherein the method further comprises:
   determining whether a reference condition is satisfied; and updating, when it is determined that the reference condition is satisfied, second map information to include the first logical address and the physical address of the second memory block that are stored in the first map information,
wherein the determining whether the reference condition is satisfied includes determining that the reference condition is satisfied when available storage capacity of the first map information is less than or equal to a threshold capacity or when all pages of the first memory block are full of data.

8. The method according to claim 7, further comprising:
migrating the first data stored in the first memory block to the second memory block; and
setting flag information of the first map information to indicate that the first data stored in the first memory block is migrated to the second memory block.

9. The method according to claim 8, further comprising:
receiving a read request including the first logical address from the external device; and
reading the first data from the first memory block or the second memory block according to the flag information.

10. The method according to claim 7, further comprising:
when a read request including the first logical address corresponding to the first data is received from the external device, reading the first data corresponding to the read request from the second memory block.

11. The method according to claim 7,
wherein the determining whether the reference condition is satisfied includes determining that a size of data managed by the first map information is greater than or equal to a threshold data size, a size of data stored in the first memory block is greater than or equal to the threshold data size, or a number of empty pages included in the first memory block is lower than or equal to a threshold value.

* * * * *